(12) United States Patent
Chiu et al.

(10) Patent No.: US 11,194,259 B2
(45) Date of Patent: Dec. 7, 2021

(54) EQUIPMENT MODULE WITH ENHANCED PROTECTION FROM AIRBORNE CONTAMINANTS, AND METHOD OF OPERATION

(71) Applicant: Taiwan Semiconductor Manufacturing Co., Ltd., Hsinchu (TW)

(72) Inventors: Chih-Chiang Chiu, Hsinchu (TW); Ding-I Liu, Hsinchu (TW); Yu-Ying Lu, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/547,301

(22) Filed: Aug. 21, 2019

(65) Prior Publication Data

US 2020/0073258 A1 Mar. 5, 2020

Related U.S. Application Data

(60) Provisional application No. 62/724,938, filed on Aug. 30, 2018.

(51) Int. Cl.
*G03F 7/20* (2006.01)

(52) U.S. Cl.
CPC ...... *G03F 7/70725* (2013.01); *G03F 7/70808* (2013.01); *G03F 7/70858* (2013.01)

(58) Field of Classification Search
CPC ............. G03F 7/70725; G03F 7/70858; G03F 7/70808; G03F 7/7075; H01L 21/67766; H01L 21/67772; H01L 21/67017; H01L 21/67011; H01L 21/67703; H01L 21/67736; H01L 21/67775; H01L 21/67781

USPC ....... 141/51, 63; 134/95.2, 95.3, 103.3, 902, 134/104.1

See application file for complete search history.

(56) References Cited

U.S. PATENT DOCUMENTS

| | | | | |
|---|---|---|---|---|
| 983,877 A | * | 2/1911 | Cummings | F24F 9/00 454/190 |
| 3,038,400 A | * | 6/1962 | Ruff | F25D 23/023 454/192 |
| 3,215,058 A | * | 11/1965 | Anderson | F24F 11/74 454/192 |

(Continued)

FOREIGN PATENT DOCUMENTS

| | | |
|---|---|---|
| CN | 101656199 A | 2/2010 |
| CN | 102176409 A | 9/2011 |

(Continued)

*Primary Examiner* — Timothy L Maust
*Assistant Examiner* — James R Hakomaki
(74) *Attorney, Agent, or Firm* — Seed IP Law Group LLP

(57) ABSTRACT

An Equipment Front End Module (EFEM) having a Front Opening Unified Pod (FOUP) dock and a tool access port, includes a robotic wafer handling system configured to transfer silicon wafers between a FOUP coupled to the FOUP dock and a process tool positioned for access via the tool access port. An air curtain system inside the EFEM is positioned to produce an air curtain across the tool access port while the port is open, acting to isolate the interior of the EFEM from the tool environment, and prevent passage of airborne contaminants into the EFEM via the access port.

20 Claims, 8 Drawing Sheets

(56) References Cited

U.S. PATENT DOCUMENTS

| | | | | |
|---|---|---|---|---|
| 3,301,162 | A * | 1/1967 | Zumbiel | F24F 9/00 454/192 |
| 3,625,133 | A * | 12/1971 | Hayashi | F24F 9/00 454/189 |
| 4,927,438 | A * | 5/1990 | Mears | F24F 3/1607 454/56 |
| 5,133,246 | A * | 7/1992 | Campbell | B05B 16/60 454/52 |
| 5,191,908 | A * | 3/1993 | Hiroe | B08B 15/00 134/76 |
| 5,213,118 | A * | 5/1993 | Kamikawa | H01L 21/67017 134/62 |
| 5,253,663 | A * | 10/1993 | Tanaka | H01L 21/67161 134/95.2 |
| 5,310,410 | A * | 5/1994 | Begin | C23C 14/566 29/25.01 |
| 5,369,891 | A * | 12/1994 | Kamikawa | F26B 3/283 34/78 |
| 5,488,964 | A * | 2/1996 | Murakami | H01L 21/67754 134/95.3 |
| 5,695,564 | A * | 12/1997 | Imahashi | C23C 14/568 118/719 |
| 5,806,543 | A * | 9/1998 | Ohmi | B08B 15/00 134/109 |
| 6,131,588 | A * | 10/2000 | Kamikawa | B08B 3/08 134/102.3 |
| 6,221,163 | B1 * | 4/2001 | Roberson, Jr. | H01L 21/67017 118/715 |
| 6,224,679 | B1 * | 5/2001 | Sasaki | B08B 5/00 118/719 |
| 6,626,971 | B1 * | 9/2003 | Forbert | F24F 1/027 454/187 |
| 6,634,370 | B2 * | 10/2003 | Nakashima | H01L 21/67167 118/500 |
| 6,634,411 | B2 * | 10/2003 | Hirano | B22D 17/20 164/113 |
| 6,638,672 | B2 * | 10/2003 | Deguchi | G03F 7/7075 414/805 |
| 6,867,153 | B2 * | 3/2005 | Tokunaga | H01L 21/67017 141/63 |
| 6,960,129 | B2 * | 11/2005 | Ashley | F25D 23/023 454/188 |
| 7,090,741 | B2 * | 8/2006 | Narushima | H01L 21/67017 118/719 |
| 7,416,998 | B2 * | 8/2008 | Kisakibaru | H01L 21/67772 141/4 |
| 7,766,566 | B2 * | 8/2010 | Kitano | G03D 5/04 396/611 |
| 7,841,371 | B2 * | 11/2010 | Okabe | H01L 21/67772 141/63 |
| 8,827,695 | B2 | 9/2014 | Hsiao et al. | |
| 9,010,384 | B2 * | 4/2015 | Yoshimura | H01L 21/67772 141/63 |
| 10,010,913 | B2 * | 7/2018 | Kaise | B08B 9/093 |
| 10,304,702 | B2 | 5/2019 | Okabe et al. | |
| 10,533,252 | B2 | 1/2020 | Chiu et al. | |
| 10,879,101 | B2 * | 12/2020 | Sharrock | H01L 21/67265 |
| 10,892,171 | B2 * | 1/2021 | Lee | H01L 21/67201 |
| 2003/0019605 | A1 | 1/2003 | Hirano et al. | |
| 2003/0110611 | A1 * | 6/2003 | Lappen | H01L 21/68 29/464 |
| 2005/0197057 | A1 * | 9/2005 | Rohrer | F24F 9/00 454/191 |
| 2005/0198857 | A1 * | 9/2005 | Nakazawa | B08B 7/0071 34/391 |
| 2006/0120833 | A1 * | 6/2006 | Bonora | H01L 21/67766 414/217 |
| 2006/0199497 | A1 | 9/2006 | Smith et al. | |
| 2007/0021047 | A1 * | 1/2007 | Huang | B25H 1/20 454/61 |
| 2008/0298933 | A1 * | 12/2008 | Hsiao | H01L 21/67393 414/172 |
| 2009/0317214 | A1 * | 12/2009 | Hsiao | H01L 21/67772 414/217 |
| 2010/0260936 | A1 | 10/2010 | Kato et al. | |
| 2010/0291956 | A1 * | 11/2010 | Iwamura | H04W 48/20 455/509 |
| 2013/0019621 | A1 * | 1/2013 | Wood | A47F 3/0478 62/126 |
| 2014/0202921 | A1 * | 7/2014 | Babbs | H01L 21/67201 206/710 |
| 2015/0024671 | A1 * | 1/2015 | Taniyama | F24F 9/00 454/193 |
| 2015/0170945 | A1 * | 6/2015 | Segawa | H01L 21/67772 414/217 |
| 2015/0228516 | A1 * | 8/2015 | Liao | H01L 21/67775 34/443 |
| 2016/0207082 | A1 * | 7/2016 | Iwamoto | B08B 5/02 |
| 2017/0203636 | A1 * | 7/2017 | Good | B62D 33/0612 |
| 2019/0019711 | A1 * | 1/2019 | Tamura | H01L 22/34 |

FOREIGN PATENT DOCUMENTS

| | | | |
|---|---|---|---|
| CN | 106876309 A | | 6/2017 |
| CN | 107267958 A | | 10/2017 |
| CN | 207713292 U | | 8/2018 |
| JP | 11145245 A | * | 5/1999 |
| JP | H1 1145245 A | | 5/1999 |
| KR | 20050064811 A | * | 6/2005 |
| KR | 20070049693 A | * | 5/2007 |
| KR | 20070049693 A | | 5/2007 |

* cited by examiner

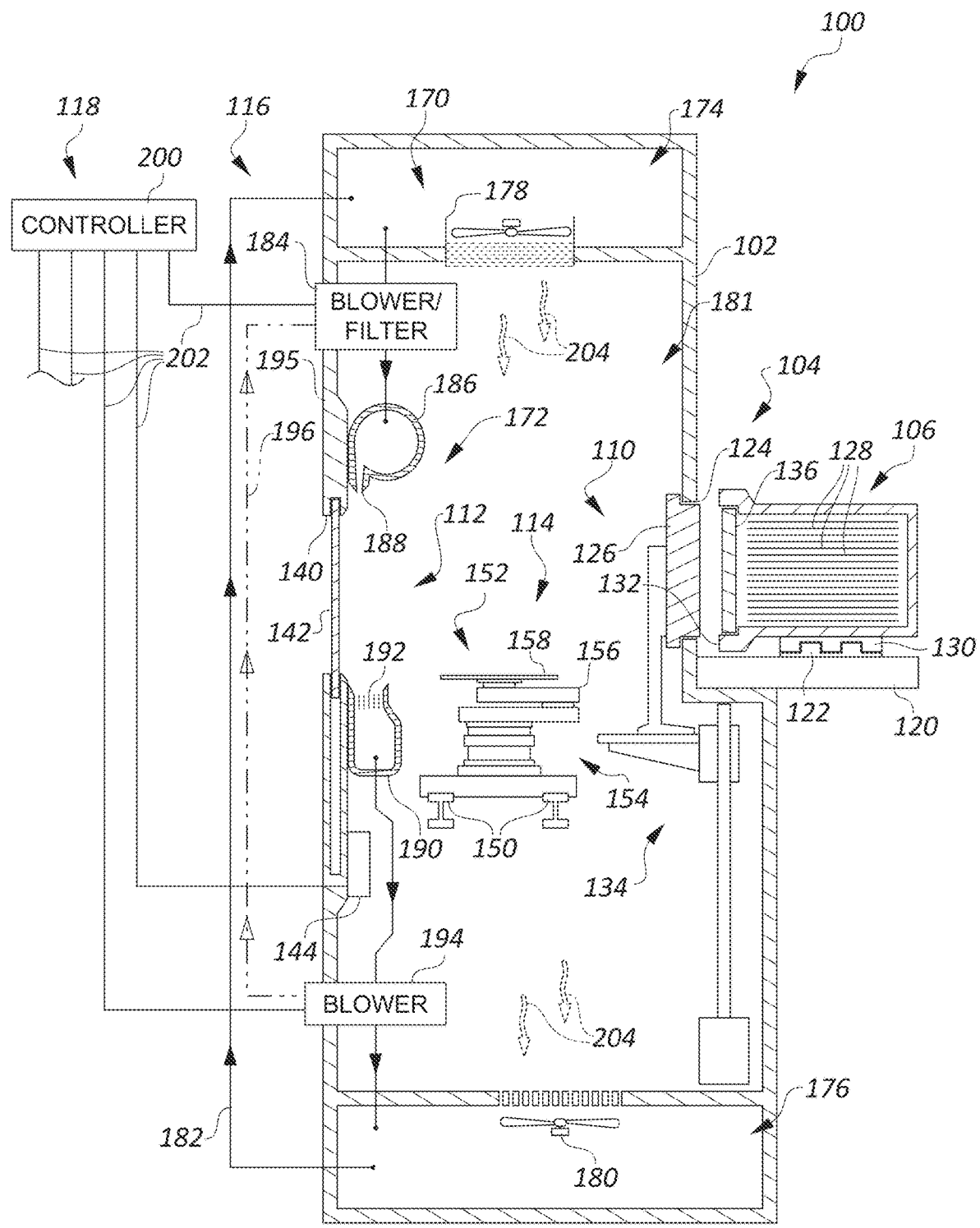
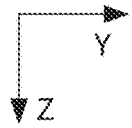
FIG. 2

EQUIPMENT MODULE WITH ENHANCED PROTECTION FROM AIRBORNE CONTAMINANTS, AND METHOD OF OPERATION

BACKGROUND

In the semiconductor industry, the processes involved in manufacturing are generally broken into two sections: front end and back end. The front-end processes are those involved with the formation of electronic and/or mechanical devices on semiconductor wafers. Once those processes are complete, the wafers are cut into chips, or "dice." The back-end processes are those directed to packaging the individual chips so that they can be electrically and physically coupled to the systems that will use them.

During the front-end operations, the wafers must be transferred from one processing machine or "tool" to another, while being continually protected from exposure to contamination by substances that would interfere with the various processes or damage the devices being formed. The substances that must be guarded against include dust and other particulate debris, fluids such as body oils, etc., and in many cases even air, because of the effects that oxygen can have on materials that might be present and exposed on the surface of a wafer at various stages of manufacture. Thus, containers, storage and transport systems, and associated standards have been developed to enable the efficient handling of semiconductor wafers, while providing the necessary protection from contamination. Collectively, these elements are referred to as Automated Material Handling Systems (AMHS).

A standard component of a typical AMHS in current use is the Front Opening Unified Pod (FOUP), which is a specialized container designed to hold a quantity of semiconductor wafers in a hermetically sealed environment for transport between various tools, and that has a cover on a vertical face—i.e., the front—that conforms to a "Front-opening Interface Mechanical Standard" (FIMS). Conformance to the FIMS enables a FOUP made by any manufacturer to be opened and closed by automated systems made by any other manufacturer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a diagrammatic side-sectional view of the EFEM of FIG. 1, according to an embodiment.

DETAILED DESCRIPTION

In many of the drawings, elements are designated with a reference number followed by a letter, e.g., "218a, 218b." In such cases, the letter designation is used where it may be useful in the corresponding description to refer to or differentiate between specific ones of a number of otherwise similar or identical elements. Where the description omits the letter from a reference, and refers to such elements by number only, this can be understood as a general reference to the elements identified by that reference number, unless other distinguishing language is used.

Further, spatially relative terms, such as "beneath," "below," "lower," "above," "upper" and the like, may be used herein for ease of description to describe one element or feature's relationship to another element(s) or feature(s) as illustrated in the figures, and are used according to the customary orientation of the elements described. However, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Likewise, X, Y, and Z axes are shown in many of the drawings, to help a viewer identify the relative orientations of the various drawings, but they are intended to indicate relative orientation, only, and do not suggest an necessary orientation, in the absolute sense.

Figure 1:
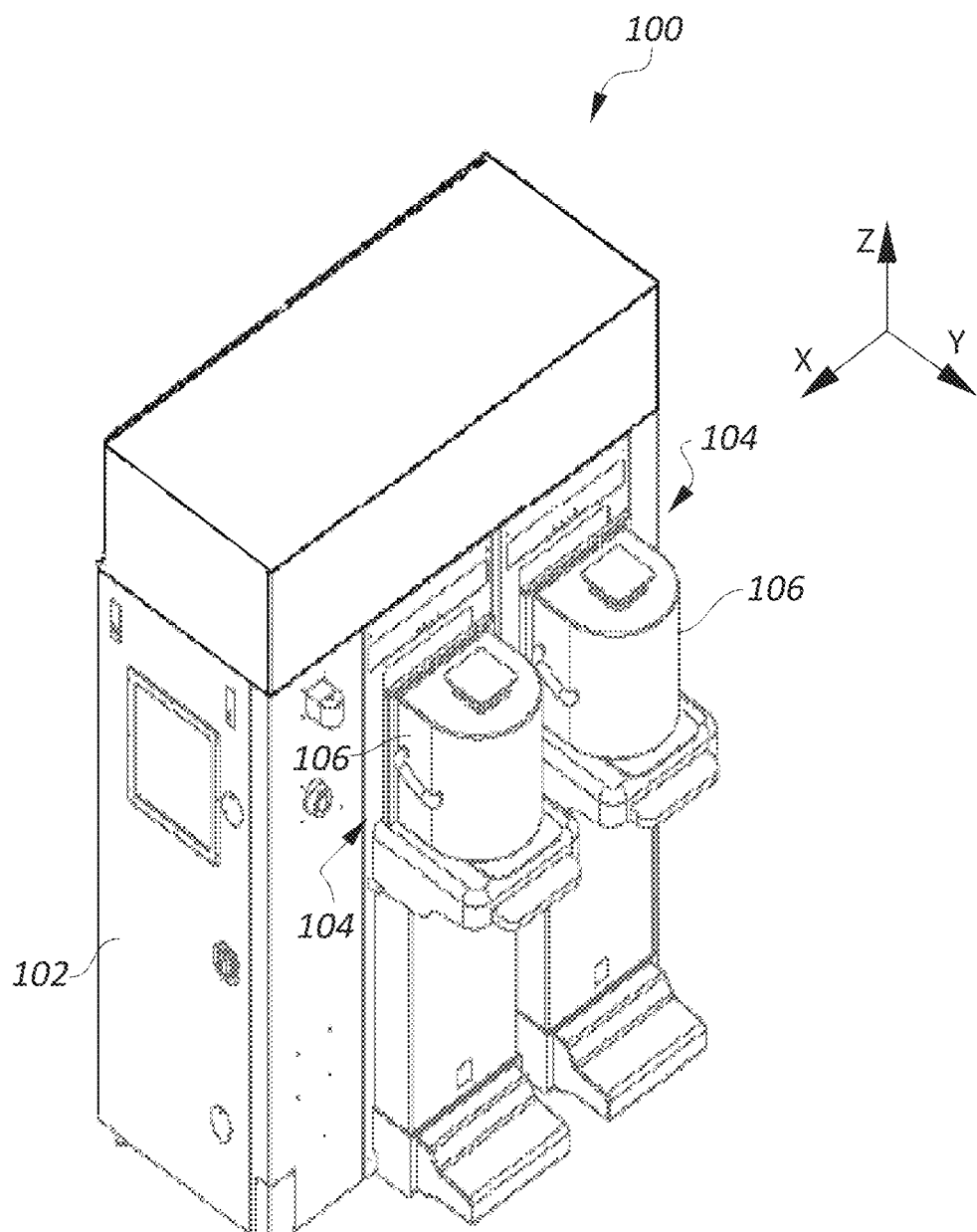
FIG. 1 is a perspective view of an Equipment Front End Module (EFEM) according to an embodiment.

FIG. 1 is a perspective view of an Equipment Front End Module (EFEM) 100, according to an embodiment. An EFEM is a device that is part of an AMHS (Automated Material Handling System), that typically houses a robotic wafer handling system, and that includes one or more FOUP docks 104. Each FOUP dock 104 is configured in accordance with the FIMS (Front-opening Interface Mechanical Standard), to receive a FOUP (Front Opening Unified Pod) and access the contents while protecting the contents from contaminants. There are a number of types of EFEMs available from different tool manufacturers, such as, e.g., Applied Materials Front-end Indexer (FI), LAM Research's Front End Module (FEM), ASM International's Front End tool (FE) and EBARA's Front End tool (FE), a wafer sorter, etc. The EFEM 100 is configured as an interface for one or more processing tools, to access a FOUP and move wafers between the FOUP and the processing tool(s).

The EFEM 100 includes a main housing 102 and a pair of FOUP docks 104. A FOUP 106 is shown coupled to each of the FOUP docks 104. The EFEM 100 is configured to be coupled to a processing tool on the side opposite the FOUP docks 104.

Figure 3:
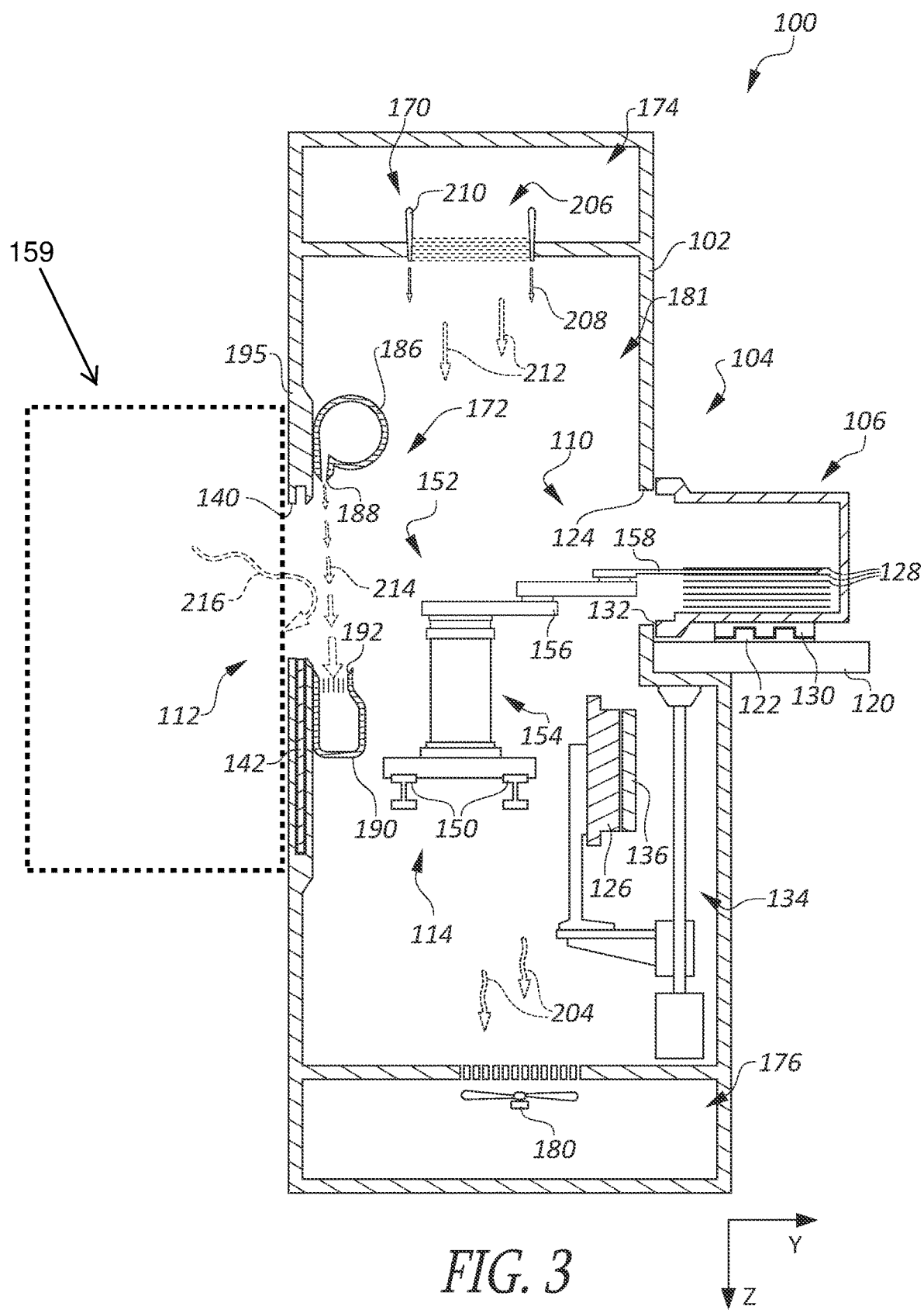
FIG. 3 is a view of the EFEM of FIG. 2, showing the EFEM during operation.

In some systems, during the processes employed in manufacturing semiconductor devices, the semiconductor-material wafers are maintained in a non-reactive atmosphere, such as an inert gas or a gas selected to be non-reactive with materials commonly used in the processing of semiconductor wafers. In such systems, the gas is typically recirculated. Other systems use ambient air, which does not require recirculation. Whether a system uses air or another gas, the atmosphere of the system must be continually purified, to remove dust and other particulate contamination, as well as gaseous contaminants that are products of many of the manufacturing processes. The systems described below with reference to FIGS. 2 and 3 are shown as recirculating systems. However, the drawings and description that follow, apart from the portions directed specifically to gas recirculation, can be applied equally well to systems that use ambient air. Furthermore, the principles of the invention, as disclosed with reference to various embodiments, are equally applicable to either type of system, recirculating or non-recirculating. As used in the claims, unless explicitly defined otherwise, the term gas is not limited to any particular gas, but includes gases selected for specific properties, such as reactivity or non-reactivity, etc.; ambient air; purified or otherwise modified air; vapors; etc.

Features of the EFEM 100 are described below with reference to FIGS. 2-5, according to various embodiments, but the drawings are diagrammatic, and depict some details of such devices schematically. Features and elements have been omitted for clarity, where such features are known in the art and are not required for an understanding of the principles described.

FIG. 2 is a diagrammatic side-sectional view of the EFEM 100 of FIG. 1, according to an embodiment, and FIG. 3 is a similar view, showing the EFEM of FIG. 2 during operation. The EFEM 100 includes the FOUP dock 104, a FOUP access control system 110, a tool interface mechanism 112, a robotic wafer handling system 114, a ventilation system 116, and a control system 118.

The FOUP dock 104 includes a FOUP receiving deck 120, a FOUP engagement mechanism 122, a FOUP access port 124, and a FOUP access port closure 126. A FOUP 106 is shown in position on the FOUP receiving deck 120, with a plurality of semiconductor wafers 128 positioned therein. The FOUP engagement mechanism 122 is configured to couple to a corresponding dock engagement feature 130 of the FOUP 106 and to bring a front face 132 of the FOUP into hermetic engagement with the FOUP access port 124.

The FOUP access control system 110 includes a FOUP barrier engagement mechanism (not shown), and a FOUP access port closure displacement mechanism 134. The FOUP barrier engagement mechanism is positioned on an outside face of the FOUP access port closure 126 and is configured to engage a FOUP barrier, e.g., door 136 of the FOUP 106, and to operate a coupling mechanism of the FOUP barrier, coupling or decoupling the barrier from a sealing engagement with the front face 132 of the FOUP 106. The FOUP access port 124 is sized to permit passage of the FOUP barrier 136, and the FOUP access port closure displacement mechanism 134 is configured to move the FOUP access port closure 126 from a closed position, as shown in FIG. 2, in which the FOUP access port 124 is hermetically sealed, to an open position, as shown in FIG. 3, in which the FOUP access port closure 126, with the FOUP barrier 136 coupled thereto, is withdrawn from the FOUP access port 124 and dropped to a position below the FOUP access port, providing access to an interior of the FOUP by the robotic wafer handling system 114.

The tool interface mechanism 112 includes a tool access port 140 in the housing 102, a tool access panel 142, and an access panel actuator mechanism 144. The housing 102 is configured to be coupled to a process tool with the tool access port 140 hermetically coupled to a process chamber of the tool. The access panel actuator mechanism 144 is configured to move the tool access panel 142 between a closed position, as shown in FIG. 2, and an open position, as shown in FIG. 3.

The robotic wafer handling system 114 includes a pair of transverse rails 150 on which a wafer transfer mechanism 152 is configured to translate along the rails within the housing 102 parallel to the X axis. The wafer transfer mechanism 152 includes an elevator mechanism 154, a robotic arm 156 and an end effector 158. The elevator mechanism 154 is configured to control the position of the robotic arm 156 and the end effector 158 in the Z axis, and the arm and end effector are configured to move semiconductor wafers 128 between the FOUP 106 and a process tool 159 coupled to the EFEM 100 on a side of the tool interface mechanism 112 opposite the FOUP 106.

The ventilation system 116 includes a housing ventilation system 170 and an air curtain system 172. The housing ventilation system 170 includes a supply plenum 174, an extraction plenum 176, a fan/filter unit (FFU) 178, an extraction fan unit 180, and a recirculation duct 182. The FFU 178 is configured to draw gas from the supply plenum 174, filter the gas, and blow the gas into an interior 181 of the housing 102 of the EFEM 100. The gas passes down through the housing 102 and is drawn into the extraction plenum 176 by the extraction fan unit 180. A pressure differential recirculates gas from the extraction plenum 176 to the supply plenum 174 via the recirculation duct 182. In embodiments that employ ambient air, the supply and extraction plenums 174, 176 are typically omitted, with the FFU 178 drawing air from outside the housing 102 and the extraction fan unit 180 blowing the extracted air back outside the housing.

In the embodiment of FIG. 2, only a single FFU 178 and extraction fan 180 are shown. However, in other embodiments, multiple FFUs and extraction fans are provided, distributed along a width (parallel to the X axis) of the EFEM 100 so as to provide ventilation throughout the housing 102.

The air curtain system 172, in accordance with embodiments of the present disclosure, includes a blower/filter 184, a gas source plenum 186, a discharge nozzle 188, a gas collection plenum 190, an intake aperture 192, and a vacuum blower 194. The discharge nozzle 188 and intake aperture 192 are positioned facing each other directly adjacent to and on opposite sides of the tool access port 140 against an internal wall 195 of the EFEM 100, and extending the length of those sides of the tool access port. In the embodiment illustrated in FIGS. 2 and 3 discharge nozzle 188 and intake aperture 192 are spaced from each other in a vertical direction; however, in other embodiments, discharge nozzle 188 and intake aperture 192 are spaced from each other, but in a direction other than vertical, for example in a horizontal direction or in a direction that is not vertical or horizontal. The blower/filter 184 is coupled between the supply plenum 174 and the gas source plenum 186, while the vacuum blower 194 is coupled between the gas collection plenum 190 and the extraction plenum 176. According to an alternative embodiment, a separate recirculation path is provided between the vacuum blower 194 and the blower/filter 184, including a recirculation duct 196 (shown in FIG. 2 in phantom lines). According to a further embodiment, the blower/filter 184 is configured to draw ambient air from outside the housing 102 and the vacuum blower 194 is configured to blow air back outside the housing.

As used herein, the term air curtain is not limited to a curtain of air, but refers generally to a curtain of any appropriate gas, e.g., inert gases.

According to an embodiment, at least the blower portion of the blower/filter 184 is positioned internal to the gas source plenum 186, and the vacuum blower 194 is positioned internal to the gas collection plenum 190. According to another embodiment, the blower/filter 184 is configured to draw gas directly from the housing interior 181, and the vacuum blower 194 is configured to discharge gas through a filter, back into the housing interior.

The control system 118 includes a controller 200 and control connections 202 coupling the controller with the blower/filter 184, vacuum blower 194, and the access panel actuator mechanism 144, as shown in FIG. 2. Other control connections, which, to simplify the drawings, are not shown, couple the controller 200 with other systems, including the FOUP dock 104, FOUP access control system 110, the robotic wafer handling system 114, the housing ventilation system 170, a GUI, etc., to control operation of actuators, encoders, sensors and transducers, and to provide user access to the controller and the various systems.

The controller 200 is shown in FIG. 2 as a single element. According to an embodiment, various functions of the controller 200 are performed by respective subsystems or processors that are located separately from each other, though to the extent necessary for proper operation, they are in communication with each other.

In FIG. 2, the EFEM 100 is shown in an idle condition, in which the FOUP access port 124 is closed by the FOUP access port closure 126, the tool access port 140 is closed by the tool access panel 142, and the robotic wafer handling system 114 is parked. In these circumstances, the air curtain system 172 need not be in operation. On the other hand, in accordance with other embodiments that include a housing ventilation system 170, the ventilation system is in constant operation, moving a filtered gas flow 204 through the housing 102, to remove contaminants from the interior 181 of EFEM 100.

According to an embodiment, the housing ventilation system 170 is similar to ventilation systems used in other wafer handling systems. The gas flow 204 from the FFU 178 passes downward through the housing 102, carrying with it contaminants that might be present, to be collected by the extraction fan 180 and the extraction plenum 176. According to another embodiment, as shown in FIG. 3, the housing ventilation system 170 includes an FFU 206 that operates according to the principles of a bladeless fan. Where a typical fan introduces turbulence by the passage of the fan blades, a bladeless fan introduces less turbulence into a stream of air. In a bladeless fan, a smooth flow of air 208 is emitted from the rim of a cylindrical housing 210. The motion of the air 208 draws and entrains additional air 212 from within and around the cylindrical housing, producing a column of moving air that retains its form for a significant distance. Turbulence, including the turbulence resulting from fan blades, tends to break up an air column and limit the distance it can travel before dissipating into the surrounding air. Turbulence can also interfere with the efficient removal of contaminants, first because it can slow or divert a flow of air, and second because it can impart unintended vectors of travel to entrained particles. A bladeless fan can project a cohesive column for a significant distance, entraining surrounding air along the way. Thus, air from the FFU 206 utilizing a bladeless fan is more effective at collecting and carrying contaminates to the extraction fan 180 at the opposite end of the EFEM 100 as compared to a FFU that utilizes a bladed fan.

When the EFEM 100 begins operation, the controller 200 controls systems of the EFEM to transition to a configuration similar to that shown in FIG. 3. The controller directs the FOUP engagement mechanism 122, coupled to the dock engagement feature 130 of the FOUP 106, to move the FOUP so as to bring the front face 132 of the FOUP into hermetic engagement with the FOUP access port 124, then controls the FOUP door engagement mechanism to engage the FOUP door 136 and to operate the coupling mechanism of the FOUP door 136, decoupling the door from the front face 132 of the FOUP 106. The FOUP access port closure displacement mechanism 134 is then controlled to withdraw the FOUP access port closure 126 from the FOUP access port 124, bringing with it the FOUP door 136 from the FOUP 106. When both are clear of the FOUP access port 124, the displacement mechanism 134 is controlled to move downward to a position that enables access to the FOUP by the robotic wafer handling system 114, and the tool access panel 142 is moved to the open position, giving access to a process tool (not shown) via the tool access port 140.

According to an embodiment, prior to moving the tool access panel 142 to the open position, the blower/filter 184 and the vacuum blower 194 of the air curtain system 172 are controlled to begin operation. The blower/filter 184 pressurizes the gas source plenum 186 to an increased pressure relative to ambient pressure, which ejects, from the discharge nozzle 188, a smooth and focused sheet of gas, i.e., an "air curtain" 214 that is collected by the gas collection plenum 190 via the intake grate 192. In certain embodiments of the present disclosure, the flow of the gas of the air curtain is laminar and not turbulent. The low pressure plenum 190 creates a negative pressure (relative to ambient pressure) at the intake grate 192. This negative pressure promotes the collection of gas of the air curtain into the intake grate 192.

According to an embodiment, the air curtain system 172 operates by principles that are similar to those of a bladeless fan. As with a bladeless fan, the discharge nozzle 188 emits a thin, smooth stream of gas that entrains surrounding gases and carries them along, retaining its shape and character for a significant distance from the nozzle, so that the gas from the nozzle and additional entrained gases are substantially recaptured by the gas collection plenum 190. However, in contrast to the cylindrical shape of the air column produced by a bladeless fan, the air curtain 214 of this embodiment has a substantially planar shape and completely overlaps the tool access port 140.

The air curtain 214 operates to provide an effective barrier between the interior 181 of the EFEM 100 and the environment of the process tool, outside the tool access port 140. In accordance with some embodiments of the present disclosure the distance between the air curtain and tool access port 140 is such that gas from inside the EFEM does not flow out tool access port 140, e.g., into a load lock chamber outside the EFEM. This is of benefit, particularly in cases where the process(es) performed by the process tool produce reactive gases or particulate residue that might be carried by air movement into the EFEM 100. Moving air 216 or airborne contaminants that encounter the air curtain 214 from either side tend either to turn from the curtain as though from a solid surface, or to be entrained by the curtain and carried to the gas collection plenum 190. The flow rate of gases of the air curtain can range over a wide range. In some embodiments, the flow rate has a gas flow Reynolds number less than about 2,100. Gas flow having a Reynolds number <2100 is laminar (also called viscous flow, line flow) and produces good results from the standpoint of serving as a barrier to particles entering the interior 181 of the EFEM 100 from the environment of the process tool, outside the tool access port 140. When the Reynolds number is more than about 2100, a transitional flow state exists. The transitional flow state is somewhere between laminar flow and turbulent flow. When transitional flow exists, the ability of the air curtain to serve as an effective barrier to particles entering the interior 181 of the EFEM 100 from the environment of the process tool, outside the tool access port 140 is diminished. When the Reynolds number is about 4000 or more, turbulent flow exists (also called turbulent flow, spoiler). When turbulent flow exists, the ability of the air curtain to serve as a barrier to particles entering the interior 181 of the EFEM 100 from the environment of the process tool, outside the tool access port 140 is diminished to an even greater degree compared to when transitional flow exists. In some embodiments, the air curtain is created using clean dry air; however, in other embodiments the air curtain is created using another dry gas, such as nitrogen.

Air traveling through the EFEM 100 can encounter turbulence-generating obstacles, which interfere with the gas flow 204/212. In particular, elements of the robotic wafer handling system 114 lie in the path. When a gas flow encounters an obstruction, it tends to form turbulence and eddys downstream from the obstruction. As previously noted, such turbulence can interfere with the efficient removal of contaminants, and can produce unpredictable flow paths within a partially obstructed space. Therefore, EFEMs employing FFUs alone may not be adequately protected from airborne contaminants.

In contrast to the housing ventilation system 170, an air curtain system 172, in accordance with embodiments of the present disclosure, operates within a limited space and mainly without obstruction, and produces a gas stream with very little turbulence. For example, in some embodiments, the only interruption or obstacle encountered by the air curtain 214 occurs when the robotic arm 156 and end effector 158 move a wafer 128 to or from a process tool.

Figure 4:
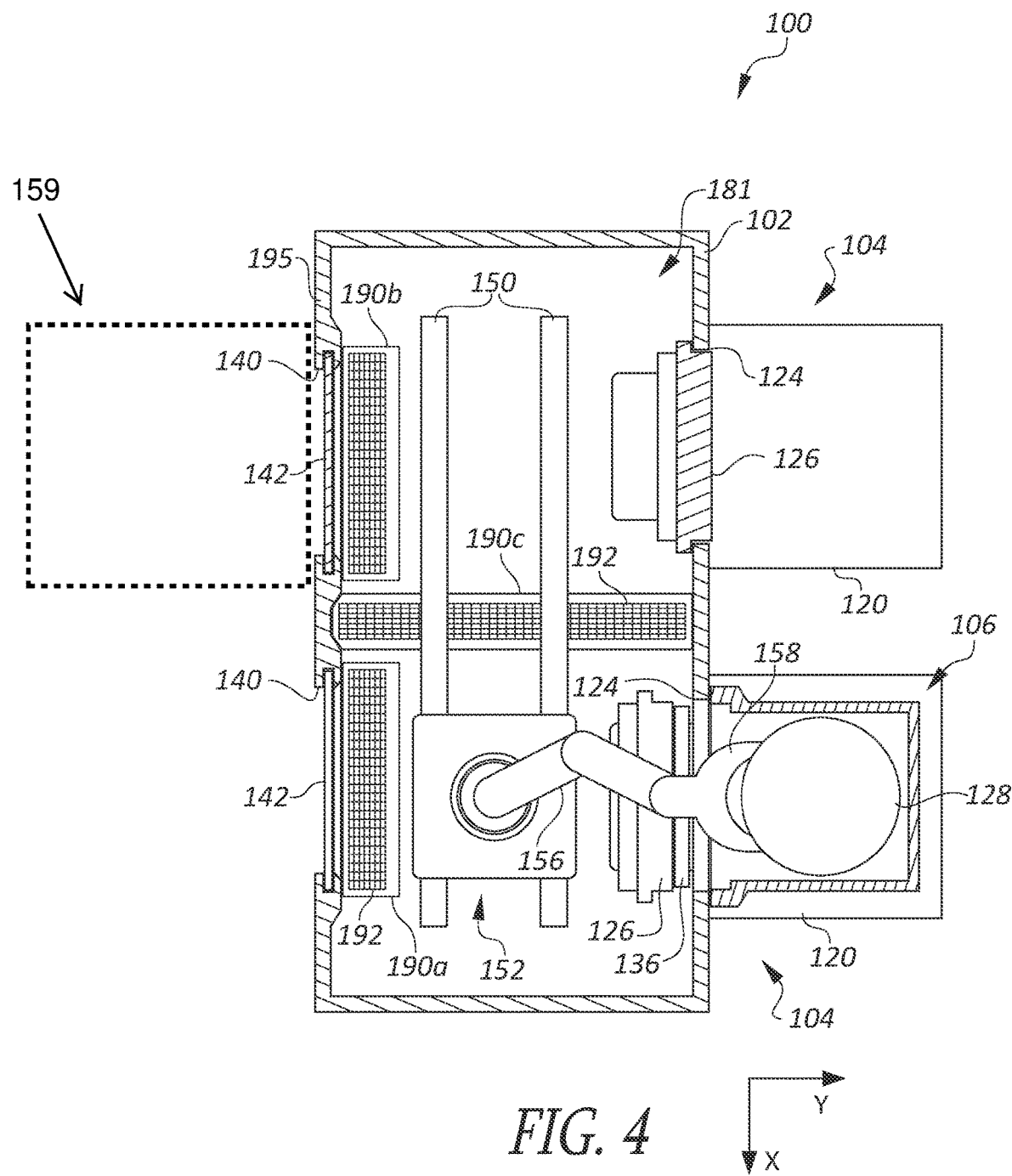
FIG. 4 is a diagrammatic plan-sectional view of the EFEM of FIG. 1, according to an embodiment, with a FOUP engaged at one of the FOUP docks.

FIG. 4 is a diagrammatic plan-sectional view of the EFEM 100 of FIG. 1, according to an embodiment, showing the pair of FOUP docks 104 with a FOUP 106 engaged at one of the FOUP docks. As configured in FIG. 4, the EFEM 100 also includes a pair of tool interface mechanisms (112 in FIG. 3), each having a respective tool access port 140 and tool access panel 142. Accordingly, an air curtain system of which the low pressure plenums 190*a* and 190*b* and intake apertures 192 are shown in FIG. 4—is provided to cover each of the tool access ports 140. Additionally, a third air curtain system is positioned to produce an air curtain in a Y-Z plane, which separates the interior 181 of the housing into two chambers, each chamber having one of the FOUP docks 104 and one of the tool interface mechanisms 112. Low pressure plenum 190*c* and intake apertures 192 of this third air curtain system are shown in FIG. 4.

In addition to the problems described above, associated with gas turbulence within the housing 102, another potential source of contamination is the faulty operation of one or more of the systems of the EFEM 100. For example, if a FOUP access control system 110 fails to fully move a FOUP access port closure 126 to its closed position, or if a seal of a FOUP access port closure is worn or defective, contaminants may be admitted into the housing 102 via the corresponding FOUP access port 124. If a FOUP 106 is docked at the other FOUP dock 104, contaminants admitted through one FOUP access port 124 may contaminate wafers 128 being handled via the other FOUP access port.

According to an embodiment, the controller 200 is configured to monitor the systems of the EFEM 100, as well as sensors within the housing 102 and to detect faults of various types, such as, e.g., improperly closed or sealed openings, malfunctions in fan or blower operation, etc., and to control operation of the other systems so as to minimize the likelihood of damage to or contamination of parts in process. For example, in the situation described above, in which there is a possibility of contamination entering via a FOUP access port 124, the controller might activate the third air curtain system, isolating the side of the housing 102 in which the fault has occurred from the other side of the housing 102 in which wafers are being transferred.

According to another embodiment, the controller 200 includes artificial intelligence (AI) programming, such that it is configured to "learn" from previous operations, so as to continually improve performance and efficiency and productivity. According to an embodiment, the controller 200 is configured to regulate the output of blowers and fans of the housing ventilation systems 170 and air curtain systems 172 so as to minimize turbulence during operation, and particularly while the wafer transfer mechanism 152 is in movement. For example, in a EFEM 100 that includes multiple FFUs, as the wafer transfer mechanism 152 traverses the interior 181 on the transverse rails 150, the controller 200 might reduce output, or completely shut down an FFU 206 as the transfer mechanism passes beneath, and/or might increase the intake of the corresponding extraction fan 180 to more strongly draw gases that are roiled by turbulence as the transfer mechanism intersects the airflow from the corresponding FFU. Similarly, as the robotic arm 156 and end effector 158 extend to move a wafer 128 into a tool via a tool access port 140, the controller 200 may reduce the output of the corresponding air curtain system 172 to reduce turbulence produced by the resulting interruption of the air curtain 214.

Figure 5:
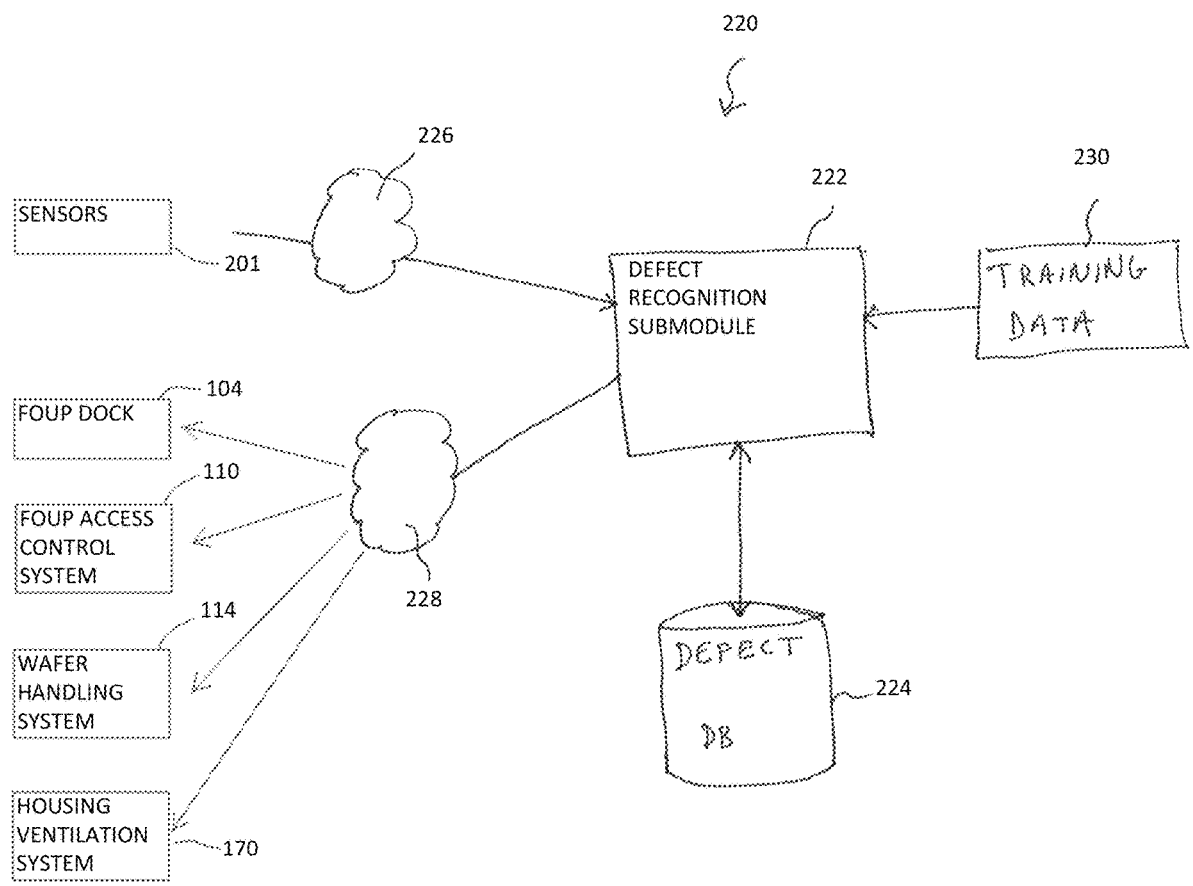
FIG. 5 is a block diagram illustrating a defect recognition system, in accordance with some embodiments.

FIG. 5 is a block diagram illustrating a controller module 220, in accordance with embodiments of the present disclosure. According to an embodiment, the controller module 220 is used in conjunction with, and may include one or more of the features and functionality of, the controller 200 described with reference to FIGS. 1-4. In some embodiments, the controller module 220 is included as a part of the controller 200. The controller module 220 is utilized to obtain an "image" of the EFEM 100, based on the information acquired by a plurality of sensors 201, corresponding to the conditions and operation of the various systems of the EFEM 100, and to detect therefrom the presence of defects in the conditions and operation of the various systems of the EFEM 100 that could result in contamination of wafers in process, such as incomplete closure of access ports, faulty operation of fans or blowers, poor coupling of FOUPs, excessive turbulence, etc.

The term image is used here to refer broadly to a representation of the EFEM 100 and its various systems, its internal environment and operating conditions, the disposition of wafers currently in process, etc., based on the information acquired by the plurality of sensors 201

As shown in FIG. 5, the controller module 220 includes a defect recognition submodule 222 and a defect database 224. According to various embodiments, the defect recognition submodule 222 includes, or is otherwise executed by, a computer processor configured to perform the various functions and operations described herein. For example, the defect recognition submodule 222 may be executed by a computer processor selectively activated or reconfigured by a stored computer program, or may be a specially constructed computing platform for carrying out the features and operations described herein.

In some embodiments, the defect recognition submodule 222 includes memory which stores instructions for performing one or more of the features or operations described herein, and the defect recognition submodule 222 is operable to execute instructions stored, for example, in the memory to perform the functions of the defect recognition submodule 222 described herein. The memory may be or include any computer-readable storage medium, including, for example, read-only memory (ROM), random access memory (RAM), flash memory, hard disk drive, optical storage device, magnetic storage device, electrically erasable programmable read-only memory (EEPROM), organic storage media, or the like.

The information acquired by the plurality of sensors 201 is provided to the defect recognition submodule 222, for example, via a communications network 226. The communications network 226 may utilize one or more protocols to communicate via one or more physical networks, including local area networks, wireless networks, dedicated lines, intranets, the Internet, and the like. In some embodiments, the communications network 226 includes one or more physical connections, such as the connectors 202, which communicatively couple the plurality of sensors 201 to the defect recognition submodule 222.

According to an embodiment, the defect recognition submodule 222 is communicatively coupled to systems of the EFEM 100, including the FOUP dock 104, the FOUP access control system 110, the robotic wafer handling system 114, and the housing ventilation system 170 by a communications network 226. The communications network 226 is substantially similar to the communications network 226, in some embodiments, and utilizes one or more protocols to communicate via one or more physical networks, including local area networks, wireless networks, dedicated lines, intranets, the Internet, and the like. In some embodiments, the communications network 228 includes one or more physical connections, such as the connectors 202, which communicatively couple the various systems to the defect recognition submodule 222.

The defect recognition submodule 222 receives the information acquired from the plurality of sensors 201 and determines whether the received information indicates the presence of one or more defects in the condition and/or operation of the various EFEM 100 systems that may result in contamination of wafers in process.

In some embodiments, the defect recognition submodule 222 may determine the presence and/or type of defects based on the received information from the plurality of sensors 201 by employing one or more artificial intelligence techniques, which in some embodiments may be implemented at least in part by the defect database 224. Some or all of the determinations described herein that are made by the defect recognition submodule 222 may be performed automatically by the defect recognition submodule, for example, in response to receiving the acquired information from the plurality of sensors.

"Artificial intelligence" is used herein to broadly describe any computationally intelligent systems and methods that can learn knowledge (e.g., based on training data), and use such learned knowledge to adapt its approaches for solving one or more problems, for example, by making inferences based on a received input, such as information from the plurality of sensors 201 and the image of the EFEM 100 derived therefrom. Artificially intelligent machines may employ, for example, neural network, deep learning, convolutional neural network, Bayesian program learning, and pattern recognition techniques to solve problems such as defect recognition in EFEM 100 systems. Further, artificial intelligence may include any one or combination of the following computational techniques: constraint program, fuzzy logic, classification, conventional artificial intelligence, symbolic manipulation, fuzzy set theory, evolutionary computation, cybernetics, data mining, approximate reasoning, derivative-free optimization, decision trees, and/or soft computing. Employing one or more computationally intelligent techniques, the defect recognition submodule 222 may learn to determine the presence and/or the type of one or more defects in the EFEM 100 and its associated systems and processes.

The defect database 224 may include a variety of information facilitating defect analysis, with respect to information acquired from the plurality of sensors 201, by the defect recognition submodule 222. In particular, the defect database 224 may contain information relating to types, causes, and consequences of various defects associated with the various systems of EFEM 100. In some embodiments, the defect database 224 also includes information associated with particular types of defects that are not likely to produce contamination of wafers processed by EFEM 100.

In some embodiments, the defect recognition submodule 222 may be trained based on training data 230. The training data 230 may include any defect information, and in some embodiments, the training data 230 may be labeled training data from which the defect recognition submodule 222 may learn to detect defects and, in some embodiments, to classify a type of detected defect. For example, the training data 230 may include a variety of training information associated with mechanical defects, turbulence defects, and non-defects. Each such training information included in the training data 230 may have slightly different characteristics (e.g., from data obtained from different sensors and/or under different conditions), and each training information included in the training data 230 may be labeled, for example, as representing a different type of defect. In some embodiments, the training data 230 may include training information representative of two or more defects.

As a result of the training, the defect recognition submodule 222 may learn to modify its behavior in response to the training data 230, and obtain or generate defect knowledge which may be stored in the defect database 224. The defect knowledge may represent any information upon which the defect recognition submodule 222 may determine the presence of and/or type of defects the condition and/or operation parameters of the EFEM 100 systems. In particular, the defect knowledge represents relationships between defect information (such as may be received from the plurality of sensors 201) and the presence or absence of defects in the condition or operation parameters of the EFEM 100 systems. The defect knowledge stored in the defect database 224 may include, for example, information associated with one or more functions, parameters, coefficients, weighting information, parameters associated with a neural network shown, or any variable which may be utilized by the defect recognition submodule 222 to determine the presence or absence of defects and/or a type of any such defects.

In some embodiments, the defect recognition submodule 222 is communicatively coupled to FOUP dock 104, FOUP access control system 110, wafer handling system 114 and/or housing ventilation system 170 by a communications network 228. The communications network 228 may be substantially the same as the communications network 226, in some embodiments, and may utilize one or more protocols to communicate via one or more physical networks, including local area networks, wireless networks, dedicated lines, intranets, the Internet, and the like. In some embodiments, the communications network 228 includes one or more electrical wires which communicatively couple the defect recognition submodule 222 to the FOUP dock 104, FOUP access control system 110, wafer handling system 114 and/or housing ventilation system 170.

In response to determining the presence of a defect, the defect recognition module 220 may output control signals to the FOUP dock 104, FOUP access control system 110, wafer handling system 114 and/or housing ventilation system 170, which may automatically control one or more operational parameters of the FOUP dock 104, FOUP access control system 110, wafer handling system 114 and/or housing ventilation system 170 based on the determined defect.

Figure 6:
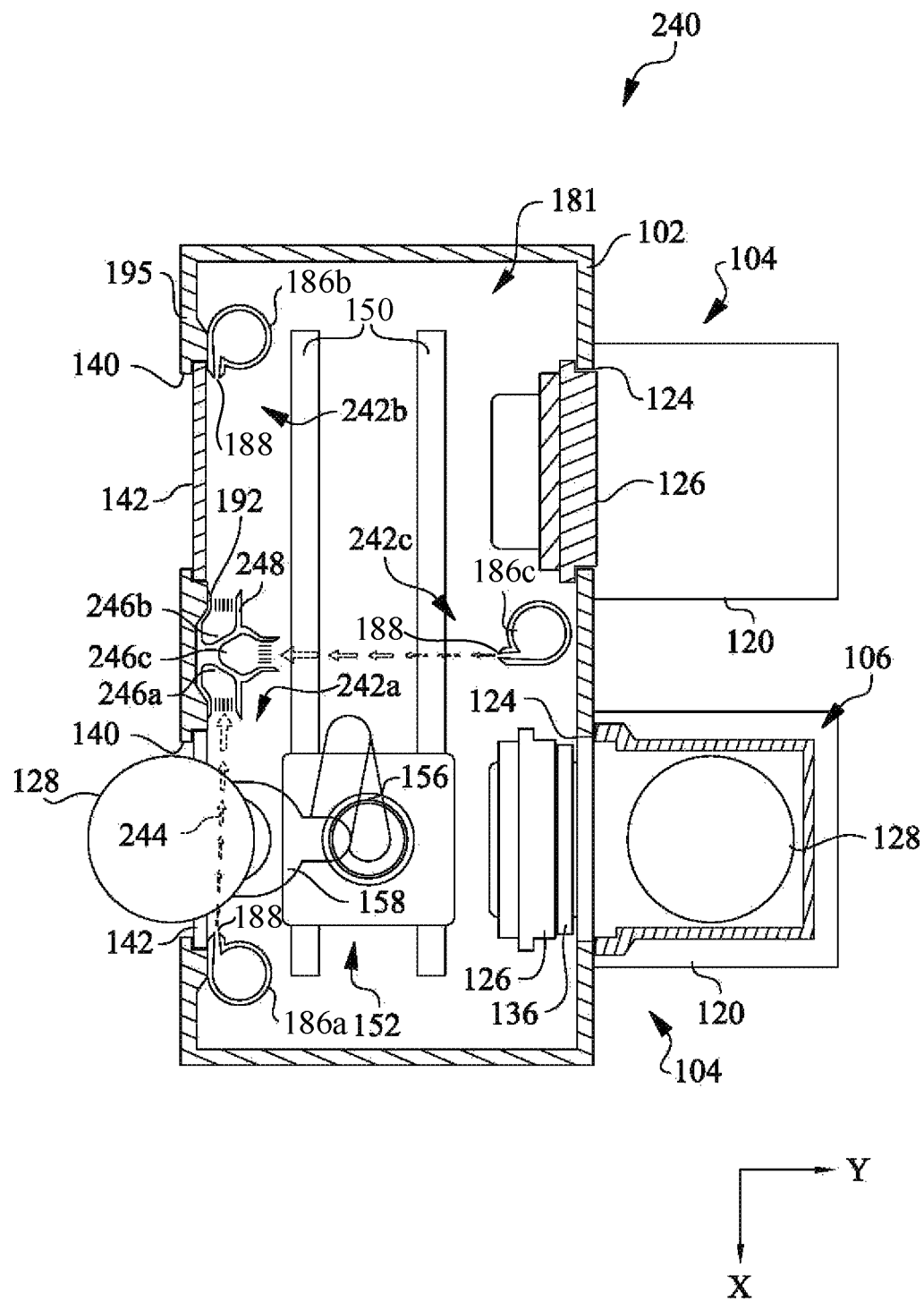
FIG. 6 is a diagrammatic plan-sectional view of an EFEM, according to another embodiment.

FIG. 6 is a diagrammatic plan-sectional view of an EFEM 240, according to an embodiment. The EFEM 240 is, in most respects, substantially similar to the EFEM 100 of FIG. 4. However, the EFEM 240 includes first, second, and third air curtain systems 242a, 242b, 242c that are positioned to produce respective air curtains 242, 244 that extend laterally, or horizontally, as compared to the air curtain systems 172, which are configured to produce air curtains 214 that extend vertically. In accordance with embodiments of the present disclosure, the flow rate of gas of the first, second and third air curtain systems 242a, 242b and 242c is the same as the flow rate of gas discussed above regarding FIG. 3. The air curtain systems 242a, 242b, 242c each include a gas source plenum 186a, 186b, 186c, a discharge nozzle 188, a gas collection plenum 246a, 246b, 246c, and an intake aperture 192. In the embodiment of FIG. 6, the shape of plenums 246b and 246a are mirror images of each, while plenum 246c does not have the same shape of plenums 246b and 246a. Plenum 246c has a symmetrical shape, whereas plenums 246a and 246b are not symmetrical in shape and include a lobe extending in a direction away from air curtain system 242c. Though not shown in FIG. 6, corresponding blowers, filters, and ducting are also provided, similar to those described with reference to FIG. 2. The distance between one gas source plenum 186a, 186b or 186c and a gas collection plenum 246a or 246b or 246c of first, second or third air curtain systems 242a, 242b and 242c can be different or can be equal to the distance between a gas source plenum 186a, 186b or 186c and a gas collection plenum 246a or 246b or 246c of one or more of the other first, second and third air curtain systems 242a, 242b and 242c. In accordance with some embodiments, the distance between gas source plenum 186a and gas collection plenum 246a is larger than opening in the EFEM formed by tool access panel 142. When the distance between gas source plenum 186a and gas collection plenum 246a is larger than opening in the EFEM formed by tool access panel 142, the side of the tool access panel 142 on the outside of the EFEM is separated by the air curtain from the side of the tool access panel 142 on the inside of the EFEM.

In the embodiment of FIG. 6, the intake apertures 192 of each of the air curtain systems 242a. 242b, 242c are contained in a single unit 248 positioned between the pair of tool access ports 140, with the first and second gas source plenums 186a, 186b positioned on the opposite side of the respective tool access port 140, and the third gas source plenum 186c positioned on the opposite side of the housing interior 181. In another embodiment, the arrangement is reversed with the high pressure plenums 186a, 186b and 186c positioned where the gas collection plenums 246a, 246b, 246c are located and the low pressure plenums located where the high pressure plenums 186a, 186b, 186c are located, while in further embodiments, other arrangements are provided.

This configuration illustrated in FIG. 6, may provide some advantages over other configurations. It can be seen, as viewed in plan view—in FIG. 4, for example—that the robotic arm 156 and end effector 158, carrying a wafer 128, present a substantial surface area to a vertically flowing stream of gas, with a commensurate potential production of turbulence, particularly while the wafer is being moved through an air curtain (214 in FIG. 3) positioned to isolate a tool access port 140. In comparison, the surface area presented by the same elements to a horizontally flowing stream of gas, e.g., 242 and 244 in FIG. 6, is much smaller, perhaps by orders of magnitude—as can be seen, for example, in the side view of the robotic arm 156, end effector 158, and wafer 128 in FIG. 3. The presentation of a reduced surface area will contribute to a reduction in turbulence being introduced into air curtain system 242b. A similar reduction of turbulence may be provided in cases where a wafer 128 is transferred through an air curtain 242c extending across the interior 181 of the housing 102 while traveling between a FOUP 106 at one end of the EFEM 240 and a tool access port 140 at the other end of the housing.

According to an embodiment, the controller 200 is configured to reduce the output of an air curtain system 242a, 242b, 242c while a wafer 128 is passing through, to reduce the likelihood that the strength of the air curtain 242 passing across the wafer will separate the wafer from the end effector 158.

Figure 8:
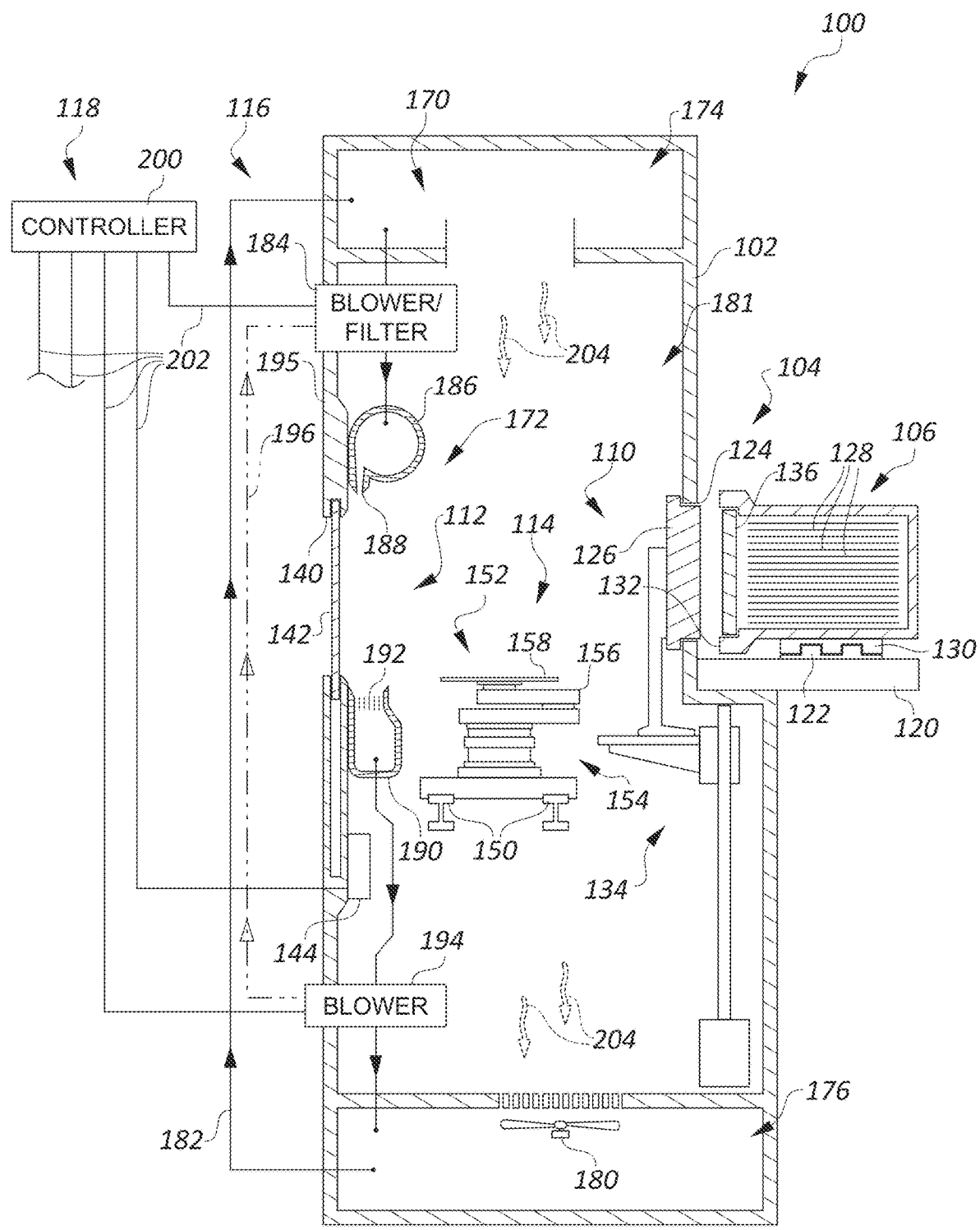
FIG. 8. is a view of the EFEM of FIG. 2 without a fan/filter unit (FFU), showing the EFEM during operation.

The disclosed embodiments are shown and described as having air curtain systems isolating tool access ports from the interior of an EFEM, and separating the interior of the EFEM into two or more respectively isolated sections. Additionally, the air curtain systems are shown and described as elements of ventilation systems that also include FFUs. According to another embodiment, the FFUs are omitted as illustrated in FIG. 8. The air curtain systems are configured and operated to provide sufficient gas circulation to remove gas-borne contaminants from the interior of the housing. According to another embodiment, air curtain systems are provided and configured to isolate the FOUP access ports from the interior, functioning substantially as described with reference to the tool access ports.

EFEMs described above are shown as having a pair of FOUP docks and a pair of tool access ports. This configuration is shown as a representative example, but there are many variations. For example, an EFEM may have different numbers of FOUP docks and/or tool access ports. In some cases, an EFEM includes additional equipment, such as, e.g., an internal wafer storage rack where wafers can be held temporarily, or equipment for performing basic processes on a wafer, such as imprinting with identification markings, or with indexing markings for alignment of later process, etc. In such cases, according to embodiments of the present disclosure, air curtain systems are provided and configured to isolate storage racks, processing equipment, etc., from other elements of the EFEM, such as FOUP docks, tool access ports, etc.

Figure 7:
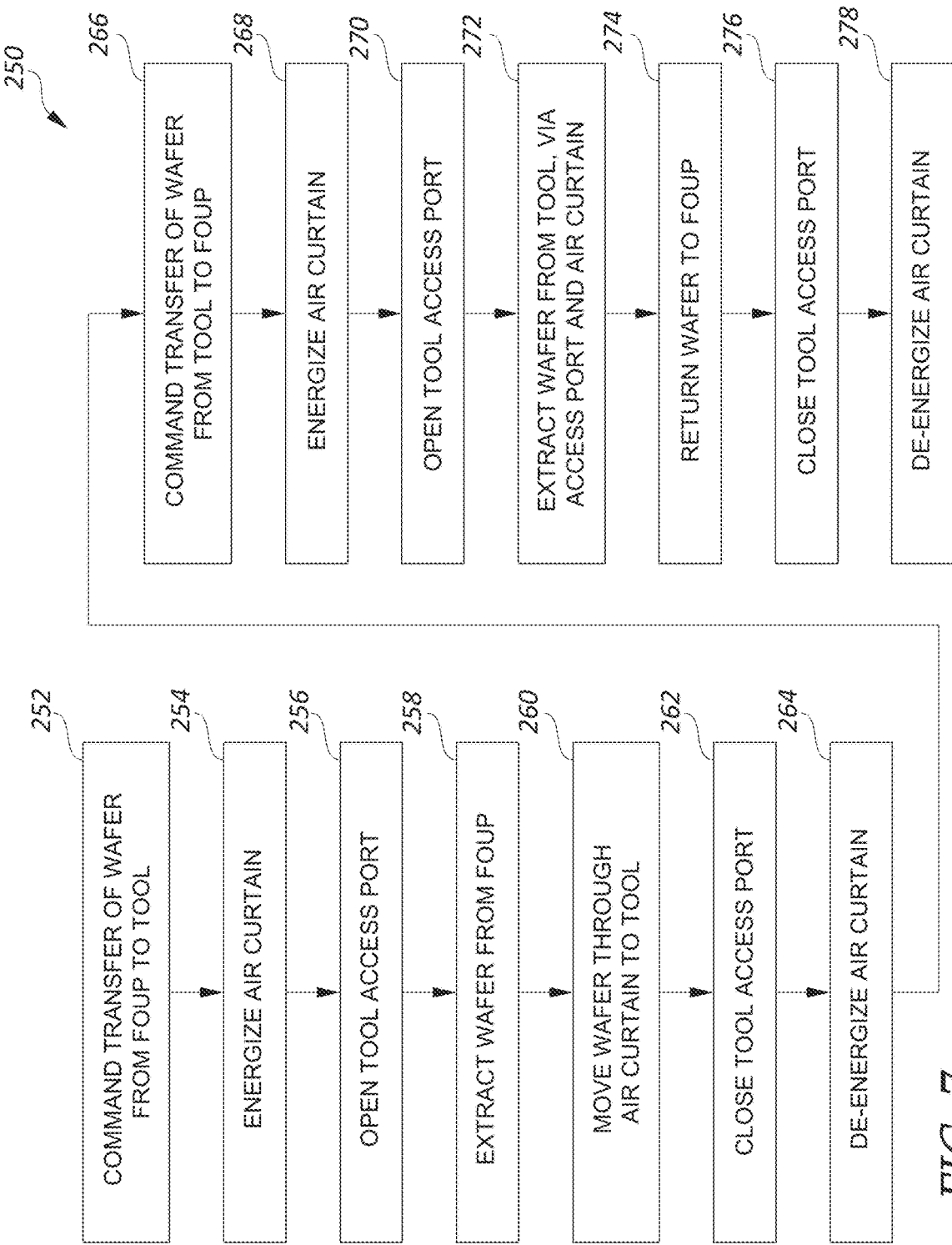
FIG. 7 is a flow chart illustrating a method of operation, according to an embodiment.

FIG. 7 is a flow chart 250 illustrating a method of operation, according to an embodiment. First, at step 252, a command is issued to transfer a wafer from a FOUP to a process tool. In response, at step 254 the controller energizes an air curtain that is positioned over the tool access port opposite which the process tool is coupled, and once the air curtain is in operation, opens the tool access port, in step 256. The controller also commands a robotic wafer transfer mechanism to extract a wafer from the designated FOUP, in step 258, and controls the transfer mechanism to move the wafer through the air curtain and access port to the tool, in step 260, after which the access port is closed and the air curtain can be shut down or its operation can be maintained, in steps 262 and 264. The process of extracting the wafer from the FOUP and moving the wafer to the tool access port can be performed while the air curtain is being activated and the tool access port is being opened, or the steps can be performed in sequence. According to an embodiment, the controller times the operation so that the tool access port opens just as the wafer approaches, and the movement of the wafer is smooth and uninterrupted from the moment it is removed from the FOUP until it is deposited in the tool. Likewise, the tool access port is closed just as the robotic arm and end effector of the wafer transfer mechanism are withdrawn from the tool access port. This timing minimizes the time during which any cross-contamination may occur between the tool and the EFEM, and also the likelihood that any particulate contamination may settle on the wafer during transit.

After processing of the wafer in the tool, a command is issued, in step 266, to transfer the wafer back to the FOUP. In response, the controller energizes the air curtain, then opens the tool access port, in steps 268 and 270. The controller then controls the wafer transfer mechanism to retrieve the wafer from the tool, via the access port and through the air curtain, in step 272, and in step 274, returns the wafer to a FOUP. After the wafer is removed from the tool, the tool access port is closed, in step 276, and the curtain is then de-energized, in step 278.

The method outlined above provides a basic process, but in practice, there are many variations. For example, in cases where there are multiple tools coupled to the EFEM, a command might be issued to move a wafer from one tool to another, via respective air curtains and access ports. Similarly, where there are multiple FOUPs coupled to respective FOUP docks of the EFEM, a command might require movement of a wafer between FOUPS, from one FOUP to a tool, from the tool to another FOUP, etc.

The inventors have recognized that wafer handling systems and manufacturing processes are continually evolving, and that many of the principles disclosed above can be advantageously applied to systems and processes that pre-date the use of FOUPs, and may also be of use in systems that evolve to accommodate further advances in materials and manufacturing. Accordingly, unless explicitly defined more narrowly, the term EFEM is used in the claims to refer generically to any device that is configured to interface with an enclosure or container with a protected environment, and that is further configured to extend that protection to its own environment while providing access to the interior of the enclosure or container. Similarly, the term FOUP is not limited to an enclosure that is configured to carry semiconductor material wafers, but to any enclosure configured to carry articles of manufacture within a hermetically closed space.

As described above, various advantages and benefits are provided, according to various embodiments. In particular, the use of air curtains at locations where entrance or movement of gas-borne contaminants is most likely can significantly reduce wafer defects that are caused by contamination of a wafer during handling. Additionally, the use of bladeless fans in FFUs can reduce turbulence and improve removal of contaminants, and providing an improved controller, including embodiments in which the controller includes AI, can reduce contamination and improve efficiency.

While the method and process steps recited in the claims may be presented in an order that corresponds to an order of steps disclosed and described in the specification, except where explicitly indicated, the order in which steps are presented in the claims is not limiting with respect to the order in which the steps may be executed.

According to an embodiment, a housing is provided, that is configured to maintain an isolated interior environment, with respect to its surroundings. The housing includes a first access port extending between an interior of the housing and an exterior of the housing, and a barrier configured to be moved between a closed position, in which the first access port is closed, and an open position, in which the first access port is open. An gas curtain system, is provided, including a gas source plenum, a discharge nozzle in fluid communication with the gas source plenum, a gas collection plenum, and an intake aperture in fluid communication with the gas collection plenum. The discharge nozzle is positioned and configured to discharge a gas curtain in a directed flow across the first access port. The discharge nozzle extends a length of a first side of the first access port. The intake aperture is positioned to receive the gas curtain discharged by the discharge nozzle. The intake aperture extending a length of a second side of the first access port, the second side of the first access port being on a side of the first access port opposite the first side.

According to an embodiment, an EFEM includes a FOUP dock, a tool access port, a tool access panel, a robotic material handling system, and an air curtain system. The FOUP dock has a FOUP access port, and is configured to receive a FOUP in hermetic engagement with the FOUP access port. The tool access port is configured to provide access from an interior of the EFEM to a process tool coupled to the exterior of the EFEM at the tool access port. A tool access panel is movable between a closed position, in which the tool access panel covers the tool access port, and an open position, in which at least a portion of the tool access port is uncovered. The robotic material handling system is configured to transfer items of manufacture between the FOUP access port and the tool access port, and the air curtain system is positioned and configured to produce an air curtain that extends across the tool access port and isolates the interior of the EFEM from an environment outside the EFEM while the tool access panel is in the open position.

According to an embodiment, a method of operation is provided. A command is received to transfer an article of manufacture from a FOUP docked at a first access port of an EFEM to a tool coupled to the EFEM at a second access port. An air curtain is produced, extending across the second access port, inside the EFEM, and after the air curtain is operating, the second access port is opened. The article of manufacture is removed from the FOUP via the first access port, and once the second access port is opened, the article of manufacture is passed through the air curtain and the second port to the tool. After the article of manufacture has been passed to the tool, the second access port is closed, and the air curtain is subsequently shut down.

Ordinal numbers, e.g., first, second, third, etc., are used in the claims according to conventional claim practice, i.e., for the purpose of clearly distinguishing between claimed elements or features thereof, etc. Ordinal numbers may be assigned arbitrarily, or assigned simply in the order in which elements are introduced. The use of such numbers does not suggest any other relationship, such as order of operation, relative position of such elements, etc. Furthermore, an ordinal number used to refer to an element in a claim should not be assumed to correlate to a number used in the specification to refer to an element of a disclosed embodiment on which that claim reads, nor to numbers used in unrelated claims to designate similar elements or features.

The abstract of the present disclosure is provided as a brief outline of some of the principles of the invention according to one embodiment, but is not intended as a complete or definitive description of any single embodiment thereof, nor should it be relied upon to define terms used in the specification or claims. The abstract does not limit the scope of the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A device, comprising:
a housing providing an isolated environment, with respect to its surroundings, and having a first tool access port extending between an interior of the housing to an exterior of the housing and a second tool access port extending between an interior of the housing to an exterior of the housing;
a first barrier configured to be moved between a closed position, in which the first tool access port is closed, and an open position, in which the first tool access port is open;
a second barrier configured to be moved between a closed position, in which the second tool access port is closed, and an open position, in which the second tool access port is open; and
a gas curtain system including a unitary unit including a first gas collection plenum and a second gas collection plenum, the gas curtain system further including:
a first gas source plenum;
a first discharge nozzle in fluid communication with the first gas source plenum and positioned to discharge a first gas curtain in directed flow across the first tool access port, the first discharge nozzle extending a length of a first side of the first tool access port; and
a first intake aperture in fluid communication with the first gas collection plenum, the first intake aperture positioned to receive the first gas curtain discharged by the first discharge nozzle, the first intake aperture extending a length of a second side of the first tool access port, the second side of the first tool access port being on a sidle of the first tool access port opposite the first side, the first intake aperture being directly adjacent to the first tool access port;
a second gas source plenum;
a second discharge nozzle in fluid communication with the second gas source plenum and positioned to discharge a second gas curtain in directed flow across the second tool access port, the discharge nozzle extending a length of a first side of the second tool access port; and
a second intake aperture in fluid communication with the second gas collection plenum, the second intake aperture positioned to receive the second gas curtain discharged by the second discharge nozzle, the second intake aperture extending a length of a second side of the second access port, the second side of the second tool access port being on a side of the second tool access port opposite the first side, the second intake aperture being directly adjacent to the second tool access port.

2. The device of claim 1, wherein the housing includes a first access port extending between the interior of the housing to the exterior of the housing.

3. The device of claim 2, comprising a Front Opening Unified Pod (FOUP) dock positioned on the exterior of the housing and including the first access port, the FOUP dock being configured to receive a FOUP over the first access port and hermetically engage the FOUP with the housing.

4. The device of claim 3, comprising a robotic handling system positioned inside the housing and configured to transfer items of manufacture between the FOUP, via the first access port, and a process tool, via the first tool access port.

5. The device of claim 1, further comprising a robotic handling system positioned inside the housing and configured to transfer items of manufacture through the first tool access port or the second tool access port.

6. The device of claim 1, wherein the housing is configured to be coupled to a process tool in a position such that an interior of the process tool is accessible via the first tool access port or the second tool access port.

7. The device of claim 1, wherein the first and second sides of the first tool access port extend vertically, and the gas curtain system is configured to produce the first gas curtain in a horizontal flow of gas across the first tool access port.

8. The device of claim 1, wherein the first and second sides of the second tool access port extend vertically, and the gas curtain system is configured to produce the second gas curtain in a horizontal flow of gas across the second tool access port.

9. The device of claim 1, comprising a controller configured to control movement of the first barrier and the second barrier between the open position and the closed position, and to control operation of the gas curtain system.

10. A device, comprising:
an Equipment Front End Module (EFEM), including:
a Front Opening Unified Pod (FOUP) dock having a FOUP access port, the FOUP dock configured to receive a FOUP and hermetically engage the FOUP with the FOUP access port;
a tool access port configured to provide access from an interior of the EFEM to a process tool coupled to the EFEM at the tool access port;
a tool access panel that is movable between a closed position, in which the tool access panel covers the tool access port, and an open position, in which at least a portion of the tool access port is uncovered;
a robotic material handling system configured to transfer items of manufacture between the FOUP access port and the tool access port; and
an air curtain system configured to produce a first air curtain that extends across the tool access port and is positioned between the interior of the EFEM and an environment outside the EFEM and a second air curtain that is transverse to the first air curtain and separates the EFEM into two chambers, the air curtain system including a first gas collection plenum and a first intake aperture in fluid communication with the first gas collection plenum and positioned to receive the first air curtain, the first intake aperture being directly adjacent to the tool access port, the air curtain system further including a low pressure plenum and an intake aperture for receiving the second air curtain.

11. The device of claim 10, wherein the air curtain system comprises:

a discharge nozzle positioned adjacent to a first side of the tool access port and extending a length of the first side of the tool access port, the discharge nozzle configured to discharge the first air curtain in a directed flow across the tool access port; and wherein, the first intake aperture is positioned adjacent to a second side of the tool access port, opposite the first side of the tool access port, and extending a length of the second side.

12. The device of claim 11, wherein the air curtain system comprises:

a gas source plenum in fluid communication with the discharge nozzle and configured to provide gas to the discharge nozzle at an increased pressure relative to an ambient pressure; and wherein the first as collection plenum in fluid communication with the first intake aperture is configured to provide a negative pressure, relative to the ambient pressure, at the first intake aperture.

13. The device of claim 10, wherein the air curtain system is configured to produce the first air curtain that extends across the tool access port and comprises a vertical flow of gas.

14. The device of claim 10, wherein the air curtain system is configured to produce the first air curtain that extends across the tool access port and comprises a horizontal flow of gas.

15. A method, comprising:

receiving a command to transfer an article of manufacture through a tool access port of an Equipment Front End Module (EFEM);

producing a first air curtain across the tool access port and within the EFEM by flowing air between a discharge nozzle and an intake aperture that is in fluid communication with a gas collection plenum, the intake aperture being directly adjacent the tool access port;

producing a second air curtain with in the EFEM, the second air curtain being transverse to the first air curtain and separating the EFEM into two chambers;

after producing the first air curtain, opening the tool access port across which the first air curtain is produced;

passing the article of manufacture through the opened tool access port and the first air curtain;

after passing the article of manufacture through the opened tool access port and the first air curtain, closing the opened tool access port;

after closing the opened tool access port, stopping the production of the first air curtain.

16. The method of claim 15, wherein the producing an air curtain across the tool access port comprises producing the air curtain comprising a vertical flow of gas across the tool access port.

17. The method of claim 15, wherein the producing an air curtain across the tool access port comprises producing the air curtain comprising a horizontal flow of gas across the tool access port.

18. The method of claim 15, wherein the command to transfer an article of manufacture through a tool access port of the EFEM is a command to transfer an article of manufacture from the EFEM to a tool.

19. The method of claim 15, wherein the command to transfer an article of manufacture through a tool access port of the EFEM is a command to transfer an article of manufacture from a tool to the EFEM.

20. The method of claim 15, wherein producing the second air curtain includes producing the second air curtain comprising a vertical flow.

* * * * *

UNITED STATES PATENT AND TRADEMARK OFFICE
CERTIFICATE OF CORRECTION

PATENT NO. : 11,194,259 B2
APPLICATION NO. : 16/547301
DATED : December 7, 2021
INVENTOR(S) : Chih-Chiang Chiu et al.

Page 1 of 1

It is certified that error appears in the above-identified patent and that said Letters Patent is hereby corrected as shown below:

In the Claims

Column 17, Claim 12, Line 17:
"wherein the first as collection plenum" should read: --wherein the first gas collection plenum--.

Signed and Sealed this
Twenty-third Day of May, 2023

Katherine Kelly Vidal
*Director of the United States Patent and Trademark Office*